(12) United States Patent
Kasuga

(10) Patent No.: US 7,614,565 B2
(45) Date of Patent: Nov. 10, 2009

(54) SEMICONDUCTOR DEVICE AND CONTROL METHOD IN SEMICONDUCTOR DEVICE

(75) Inventor: Kazunori Kasuga, Kawasaki (JP)

(73) Assignee: Fujistu Limited, Kawasaki (JP)

( * ) Notice: Subject to any disclaimer, the term of this patent is extended or adjusted under 35 U.S.C. 154(b) by 611 days.

(21) Appl. No.: 11/287,231

(22) Filed: Nov. 28, 2005

(65) Prior Publication Data

US 2007/0040038 A1    Feb. 22, 2007

(30) Foreign Application Priority Data

Aug. 19, 2005   (JP) .............................. 2005-238617

(51) Int. Cl.
*G06K 19/06*   (2006.01)

(52) U.S. Cl. .................. 235/492; 235/486; 235/375; 235/380

(58) Field of Classification Search ................ 235/492, 235/486, 375, 380
See application file for complete search history.

(56) References Cited

U.S. PATENT DOCUMENTS

| 6,802,008 B1 | 10/2004 | Ikefuji et al. |
| 2005/0060991 A1 * | 3/2005 | Tsutsumoto et al. .......... 60/295 |

FOREIGN PATENT DOCUMENTS

| EP | 0509567 A2 | 10/1992 |
| JP | 5-88986 | 4/1993 |
| JP | 9-16477 | 1/1997 |
| JP | 10-320293 | 12/1998 |
| JP | 11-328036 | 11/1999 |
| JP | 2001-195307 | 7/2001 |
| JP | 2001-202167 | 7/2001 |
| JP | 2002-73422 | 3/2002 |

* cited by examiner

*Primary Examiner*—Karl D. Frech
(74) *Attorney, Agent, or Firm*—Westerman, Hattori, Daniels & Adrian, LLP

(57) ABSTRACT

A load detection circuit 40 detects a load value of a load portion 100 via a terminal DQ. A reference load, corresponding to the load of a probe, is output from a reference load output section. A comparison circuit 60 judges whether the detected load value matches the reference load, and outputs a control signal if matched. If this control signal is input, an input and output buffer 30 stops the output of the data from a memory cell 10 to the terminal DQ, or outputs a specific logic.

5 Claims, 7 Drawing Sheets

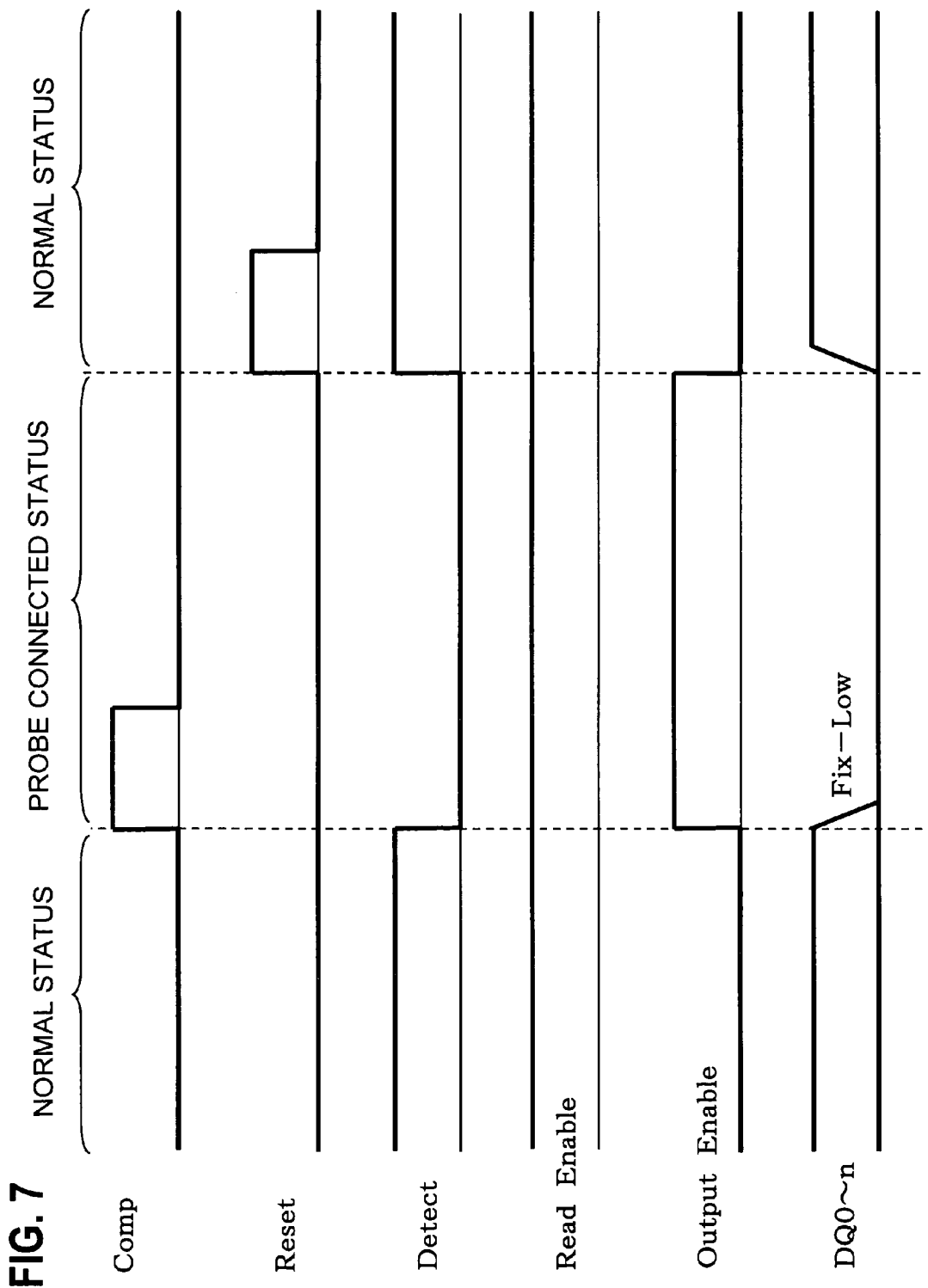

SEMICONDUCTOR DEVICE AND CONTROL METHOD IN SEMICONDUCTOR DEVICE

CROSS-REFERENCE TO RELATED APPLICATIONS

This application is based upon and claims the benefit of priority from the prior Japanese Patent Application No. 2005-238617, filed on Aug. 19, 2005, the entire contents of which are incorporated herein by reference.

BACKGROUND OF THE INVENTION

1. Field of the Invention

The present invention relates to a semiconductor device and a control method in a semiconductor device, and more particularly to a semiconductor device in which information will not be analyzed even if an analyzer is connected.

2. Description of the Related Art

Recently leakage and the theft of personal information and confidential information are becoming problems in such information terminal devices as notebook type personal computers and PDAs (Personal Digital Assistants). Such personal and confidential information is normally stored in a memory and a storage device of an information terminal device. Therefore to prevent the leakage of information, countermeasures must be taken for these memories.

As an example of such a countermeasure, an information processing device wherein data in memory is deleted when detachment of the memory is detected is disclosed (e.g. Japanese Patent Application Laid-Open No. 2002-73422).

Also a processing device, wherein a decoding key to read confidential data of a storage device is stored on another storage device, and the decoding key becomes invalid if the storage device storing the confidential data is removed, is disclosed (e.g. Japanese Patent Application Laid-Open No. H9-16477).

Also a computer, wherein the content of the memory is encrypted and written in memory just before power OFF, and is decoded when power is turned ON, so that the content of the memory, which is encrypted, cannot be viewed after power OFF, is disclosed (e.g. Japanese Patent Application Laid-Open No. 2001-202167).

Also an IC card, wherein the content of the memory is erased if the thin film battery is removed or the card itself is opened (e.g. Japanese Patent Application Laid-Open No. H11-328036, No. 2001-195307, and No. H10-320293), and a device with a safety information external access prevention function, wherein the content of the memory is reset if stress is applied to the piezo-electrical material (e.g. Japanese Patent Application Laid-Open No. H5-88986), are also available.

These prior arts, however, largely insure safety by erasing the content of a memory when the memory is removed from a device, and if a measurement device or an analyzer, such as a logic analyzer and oscilloscope for analyzing memory content, are used, the memory content can be analyzed without removing the memory.

Even if the content is encrypted at power OFF, it is still possible to analyze the content of the memory using such an analyzer during power ON.

Therefore according to these prior arts, the content of a memory, such as stored personal information, could be analyzed and stolen by an analyzer.

SUMMARY OF THE INVENTION

With the foregoing in view, it is an object of the present invention to provide a semiconductor device with which information is not analyzed even if an analyzer or a measurement device is connected, and a control method in the semiconductor device.

To achieve the above object, the present invention is a semiconductor device, comprising a load detection portion for measuring the load quantity of the load connected to a terminal, and outputting a control signal if the load quantity substantially matches a reference load, and an output control portion for stopping the output of data from the terminal or outputting a specific logic to the terminal, responding to the control signal.

In the semiconductor device according to the present invention, the load detection portion further comprises a reference load output portion for outputting the reference load, and a comparison portion for comparing the measured load quantity and the load quantity from the reference load output means, and outputting the control signal according to the comparison result.

Also in the semiconductor device according to the present invention, the load detection portion further comprises a reference register for outputting the reference load which is digitized, a digital conversion portion for converting the measured load quantity into a digital value, and a comparison portion for comparing the load quantity which has been converted into a digital value and the reference load from the reference register, and outputting the control signal according to the comparison result.

Also in the semiconductor device according to the present invention, the reference load is a load quantity when a probe of an analyzer, for reading and analyzing the data, is connected to the terminal.

Also the semiconductor device according to the present invention further comprises a storage portion for storing the data, wherein the output control portion stops the output of the data stored in the storage portion from the terminal, or outputs a specific logic, responding to the control signal.

Also to achieve the above object, the present invention is a control method in a semiconductor device comprising a load detection portion for measuring load quantity of a load connected to a terminal and an output control portion for outputting data from the terminal, comprising the steps of outputting a control signal from the load detection portion if the measured load quantity substantially matches a reference load, and stopping the output of the data from the terminal by the output control portion or outputting a specific logic from the output control portion to the terminal, responding to the control signal.

According to the present invention, a semiconductor device with which information is not analyzed even if an analyzer or a measurement device is connected, and a control method in the semiconductor device can be provided.

BRIEF DESCRIPTION OF THE DRAWINGS

FIG. 7 is a diagram depicting an operation waveform.

DESCRIPTION OF THE PREFERRED EMBODIMENTS

Preferred embodiments of the present invention will be described with reference to the drawings.

Figure 1:
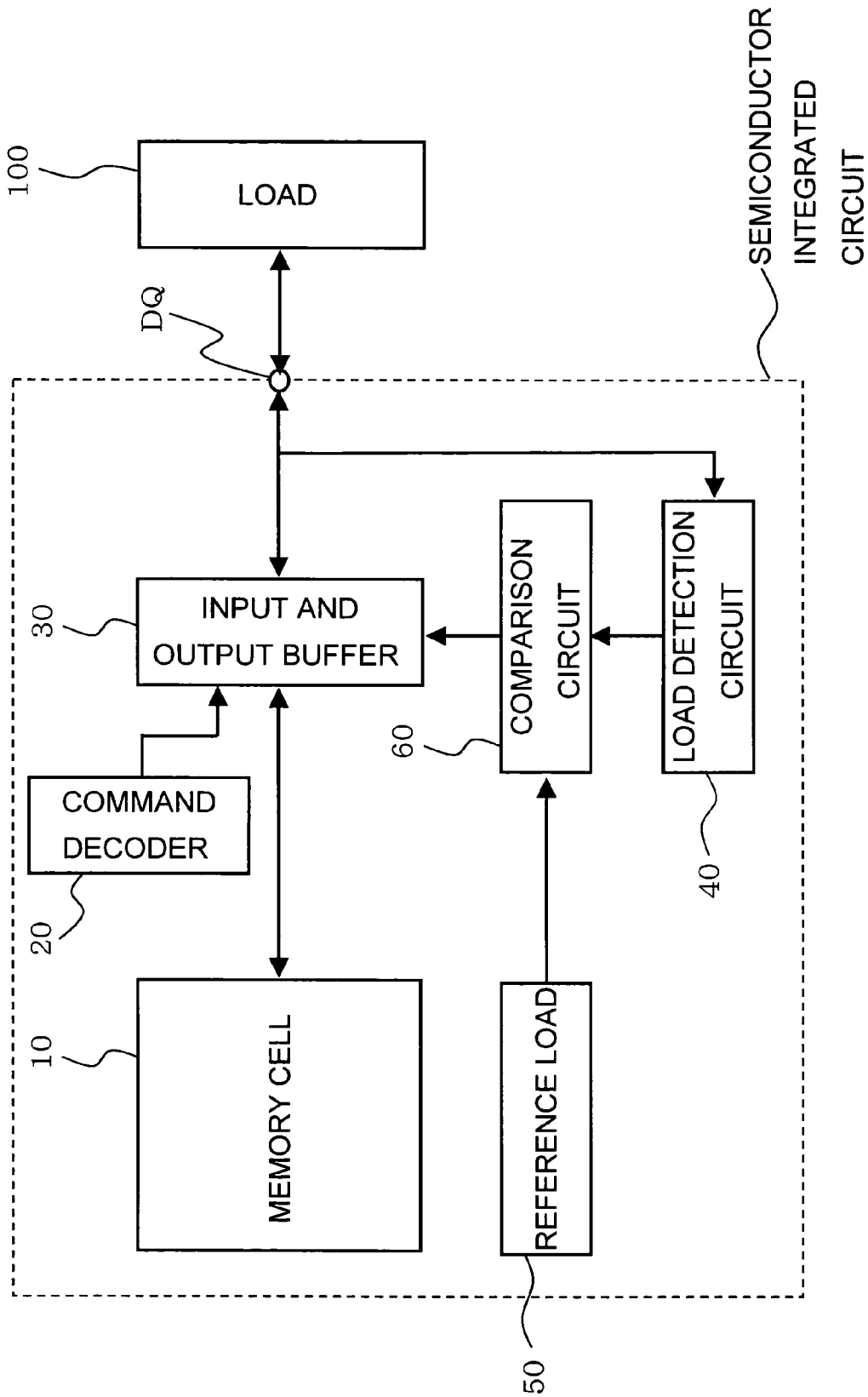
FIG. 1 is a diagram depicting a configuration example of a semiconductor integrated circuit to which the present invention is applied.

FIG. 1 is a drawing depicting a configuration example of a semiconductor integrated circuit 1 to which the semiconductor device according to the present invention is applied.

As FIG. 1 shows, the semiconductor integrated circuit 1 comprises a memory cell 10, command decoder 20, input and output buffer 30, load detection circuit 40, reference load output section 50 and comparison circuit 60.

The memory cell 10 is a storage device where various data is stored. In the present embodiment, such data as confidential information and personal information are also stored.

The command decoder 20 is connected to the input and output buffer 30, and outputs enable signals for indicating a data write and data read to the memory cell 10 ("WriteEnable" and "ReadEnable" respectively).

The input and output buffer 30 is also connected to the memory cell 10 and the terminal DQ. The input and output buffer 30 temporarily stores the data which is input from the terminal DQ, and then outputs it to the memory cell 10. The input and output buffer 30 also temporarily stores data which is read from the memory cell 10, and then outputs it to the terminal DQ. These operations are executed according to enable signals ("WriteEnable" and "ReadEnable" respectively).

The load detection circuit 40 is connected to the terminal DQ. The load detection circuit 40 detects the load value (e.g. load current or load capacity) of the load portion 100 connected to the terminal DQ, and outputs the value. The load portion 100 is an IC for the controller or a probe of an analyzer, for example.

The reference load output section 50 outputs the reference load. The reference load is a numeric value when the load value of the load portion 100 and the load of the probe of the analyzer are added.

The comparison circuit 60 is connected to the load detection circuit 40 and the reference load output section 50, and is also connected to the input and output buffer 30. The comparison circuit 60 compares the load from the load detection circuit 40 and the reference load from the reference load output section 50, and outputs the control signal to the input and output buffer 30 if both values match. In other words, if the probe is connected to the terminal DQ, the control signal is output from the comparison circuit 60.

Using this control signal, the input and output buffer 30 stops the output of the data which was read from the memory cell 10 or outputs a specific fixed logic ("0" or "1") to the terminal DQ. In other words, if the probe is connected to the terminal DQ, the output of the data from the terminal DQ is stopped, or a specific logic is output, so that the data stored in the memory cell 10 cannot be read.

Figure 2:
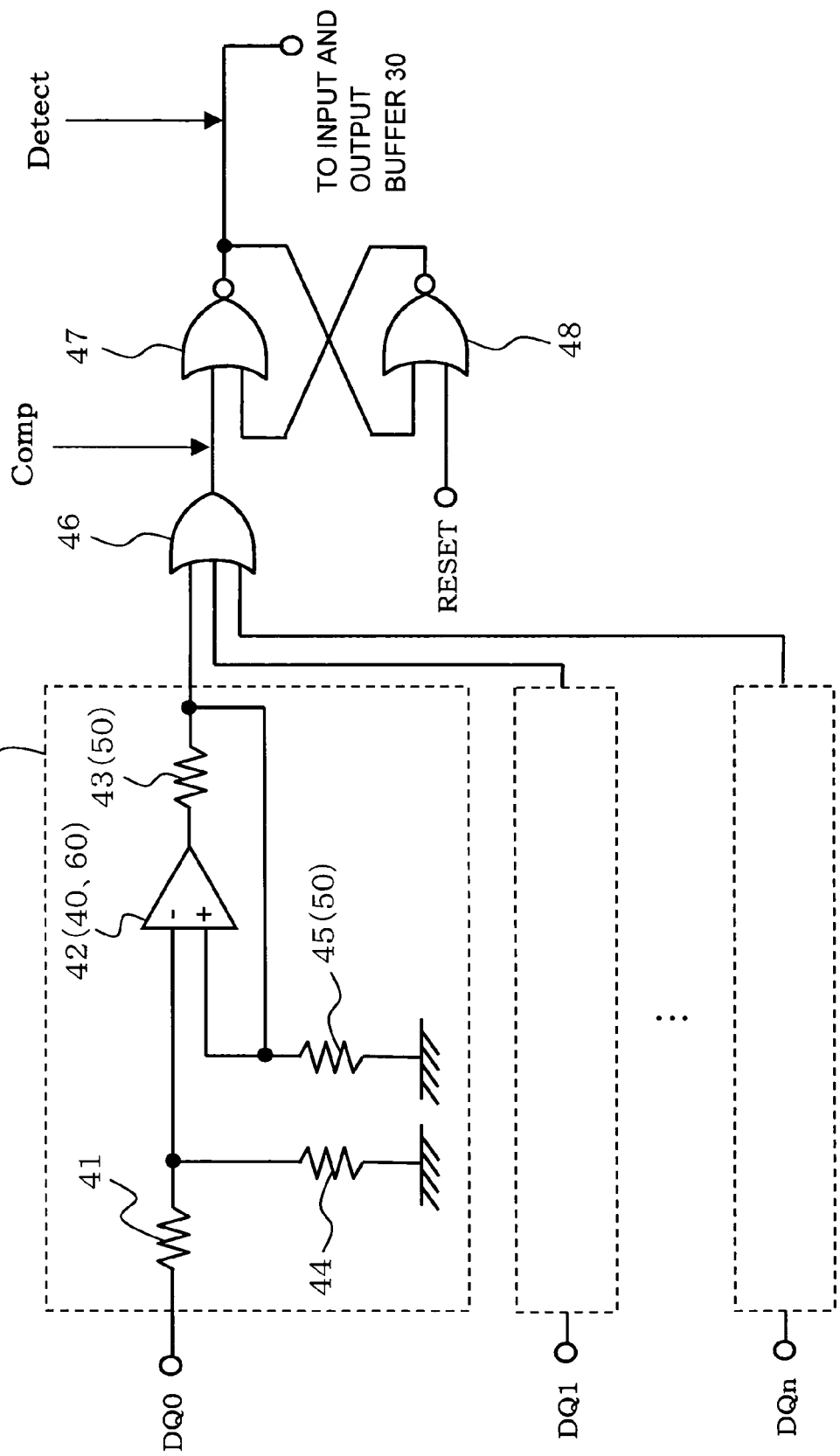
FIG. 2 is a diagram depicting a configuration example of a load detection circuit, reference load output section and comparison circuit.

FIG. 2 is a diagram depicting a detailed configuration example of a circuit including the load detection circuit 40, reference load output section 50 and comparison circuit 60. These circuits, 40, 50 and 60, are disposed for the number of terminals (n+1 in the case of the example in FIG. 2).

The circuit 40, 50 or 60 is comprised of an input resistor 41, comparator 42, output resistor 43, first reference resistor 44 and second reference resistor 45.

One end of the input resistor 41 is connected to the terminal DQ0 and the other end is connected to the comparator 42. One end of the first reference resistor 44, of which the other end is grounded, is connected between the input resistor 41 and the comparator 42.

The output resistor 43 is disposed at the output side of the comparator 42 such that the output of the output resistor 43 is also inputted to the comparator 42. And one end of the second reference resistor 45, of which the other end is grounded, is connected between the output of the output resistor 43 and the comparator 42.

The comparator 42, of which the plus (+) side is the reference voltage, outputs the input current which is inputted to the terminal DQ0, if the voltage value of the minus (−) side is higher than the reference voltage.

The current to be input to the terminal DQ0 when a probe is connected to the terminal DQ is different from when an IC for the controller is connected (normal status). Therefore if the reference voltage is adjusted so that this current is outputted when a probe is connected to the terminal DQ, the circuits 40, 50 and 60 output a predetermined voltage value only at this time. For example, if a probe is connected, the circuits 40, 50 and 60 output a voltage value corresponding to logic "HIGH", and outputs a voltage value corresponding to "LOW" otherwise.

The reference voltage in the comparator 42 is adjusted by changing the resistance values of the output resistor 43 and second reference resistor 45. For example, by connecting the external terminal with the resistors 43 and 45, and by changing the resistance values by the control signals from the outside, the reference voltage can be adjusted. In the same way, the first reference voltage 44 can also be adjusted from the outside.

The reference voltage at the plus side of the comparator 42 becomes the reference load, and is compared with the voltage value at the minus side, so the comparator 42 corresponds to the load detection circuit 40 and the comparison circuit 60, and the output resistor 43 and the second reference resistor 45 correspond to the reference load output section 50.

In the subsequent step of each circuit 40, 50 and 60, an OR circuit 46 and a latch circuit comprised of two NOR circuits, 47 and 48, are disposed.

The OR circuit 46 outputs the signal Comp, which indicates whether a probe is connected to the terminals DQ0-DQn, the output thereof is latched by the latch circuit, and the detection signal Detect is output.

If a probe is connected to one of the terminals DQ0-DQn, for example, the signal Comp becomes "HIGH" and the detection signal Detect becomes "LOW". This output signal Comp or the detection signal Detect corresponds to the control signal which is outputted from the comparison circuit 60 to the input and output buffer 30.

Figure 3:
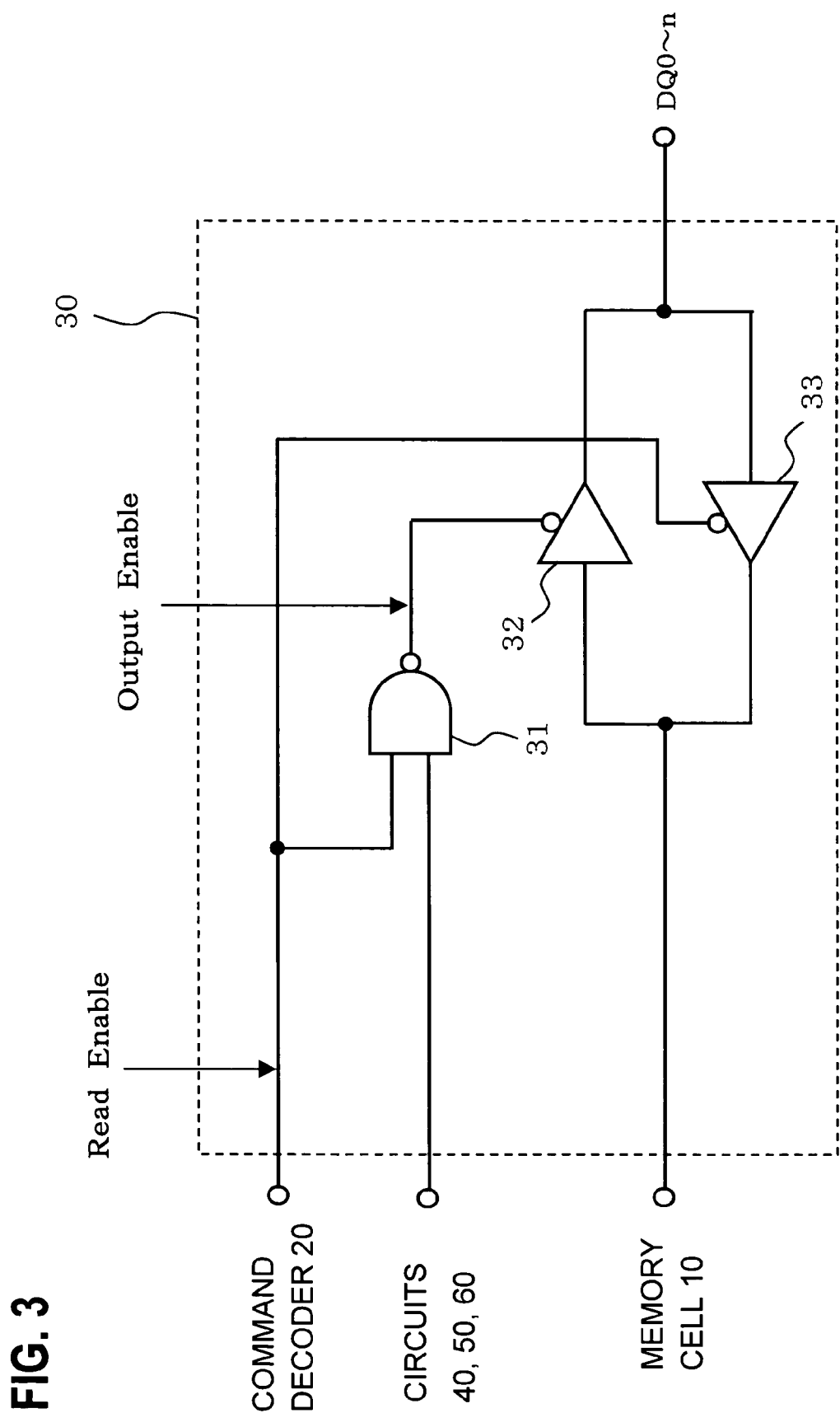
FIG. 3 is a diagram depicting a configuration example of an input and output buffer.

FIG. 3 is a diagram depicting a configuration example of the input and output buffer 30. This is a block diagram in the case of stopping the output of data read from the memory cell 10.

The input and output buffer 30 is comprised of the NAND circuit 31, and the first and second buffer circuits 32, 33.

The NAND circuit 31 is connected to the command decoder 20 and the NOR circuit 47 (see FIG. 2), to which the Enable signal from the command decoder 20 and the output signal from the comparison circuit 60 are input, and from which the output signal OutputEnable is output.

The first buffer 32 stores the output from the memory cell 10, and outputs it to the terminals DQ0-DQn. The first buffer 32 is a buffer corresponding to the data read from the memory cell 10.

The first buffer 32 has a three-state circuit configuration, and can enter "HIGH", "LOW" and high impedance (hereafter "HIGH-Z") status. Whether the first buffer 32 can enter "HIGH-Z" status or not depends on the output signal OutputEnable.

For example, when the output signal OutputEnable is "HIGH", the first buffer 32 enters "HIGH-Z" status, where electric connection is cleared, and output to the terminals DQ0-DQn is stopped. On the other hand, when the output signal OutputEnable is "LOW", logic according to the input is output.

The second buffer 33 as well can enter three statuses: "HIGH-Z", "LOW", and "HIGH". The second buffer 33 is a buffer corresponding to the writing to the memory cell 10.

Figure 4:
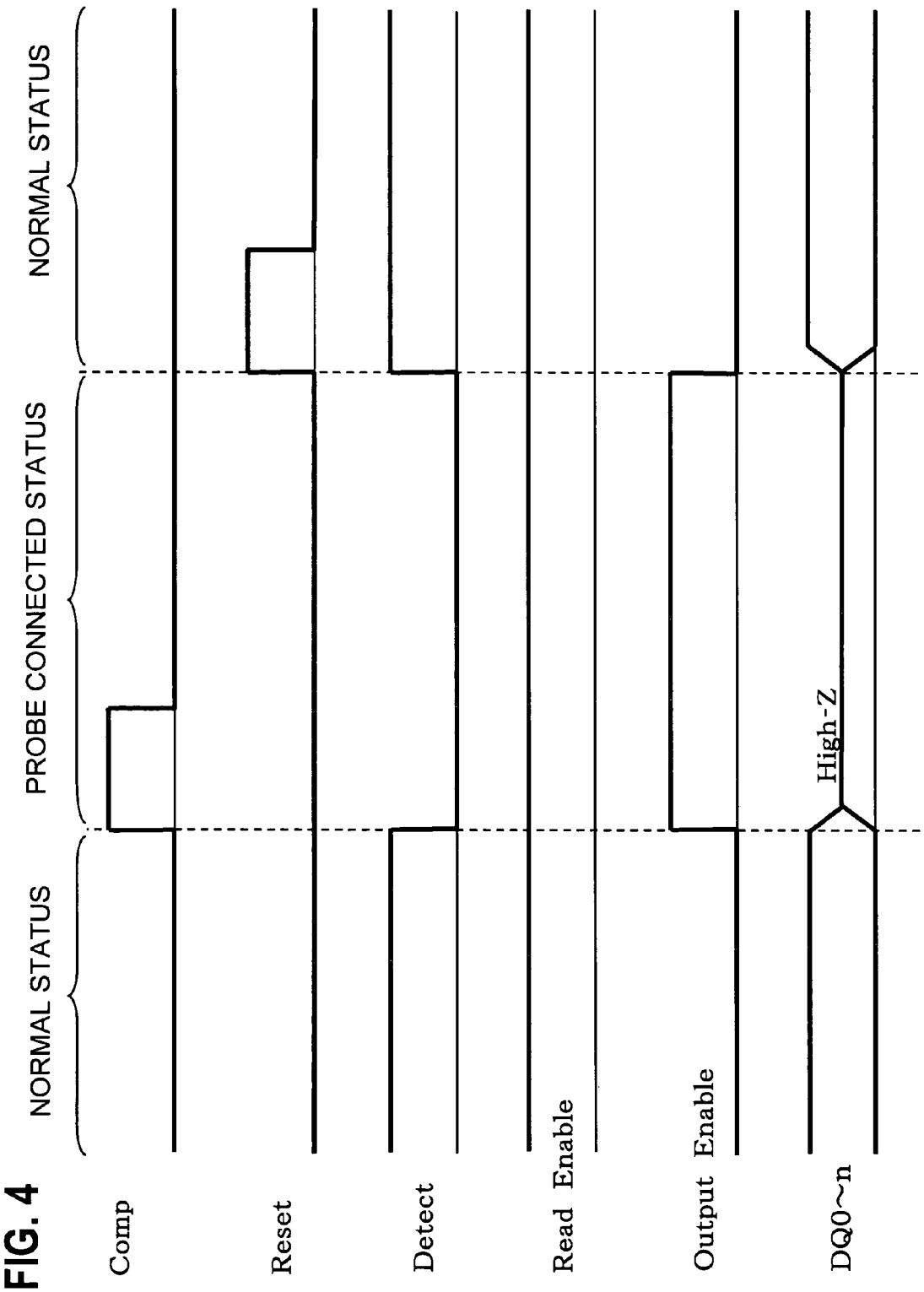
FIG. 4 is a diagram depicting an operation waveform.

FIG. 4 is a waveform diagram depicting the operation of each signal in the configurations shown in FIG. 2 and FIG. 3. This is an example of the case if the probe is connected in normal status to the terminal DQ and then the status returns to normal status again.

In normal status, "LOW" is outputted from each circuit 40, 50 and 60. Therefore the output signal Comp of the OR circuit 46 is "LOW". It is inverted by the latch circuit comprised of two NOR circuits 47 and 48, and the detection signal Detect becomes "HIGH".

If the ReadEnable signal, which indicates the reading from the memory cell 10, is being outputted from the command decoder 20 (when ReadEnable is "HIGH"), the output signal OutputEnable of the NAND circuit 31 is "LOW" since the input is "HIGH". By this, in the first buffer circuit 32, data is outputted from the memory cell 10 to the terminals DQ0-DQn.

If a probe is connected to the terminal DQ0, for example, in this status, a signal to indicate the connection of the probe is output from the circuits 40, 50 and 60, so the output signal Comp becomes "HIGH". And the detection signal Detect becomes "LOW".

If the detection signal "LOW" is input to the NAND circuit 31 in a status where the ReadEnable signal "HIGH" is being outputted from the command decoder 20, the output signal OutputEnable becomes "HIGH". Therefore the first buffer circuit 32 outputs "HIGH-Z", and the reading from the memory cell 10 is stopped. In other words, if a probe is connected to the terminal DQ0, the reading from the memory cell 10 is stopped.

If the probe is removed from the terminal DQ0, the status returns to normal, and the output signal Comp becomes "LOW". In this case, the RESET signal is input from the input end of the NOR circuit 48 shown in FIG. 2 ("HIGH"), and each circuit is returned to normal status. Hereafter operation performed is the same as the above mentioned normal status.

Figure 5:
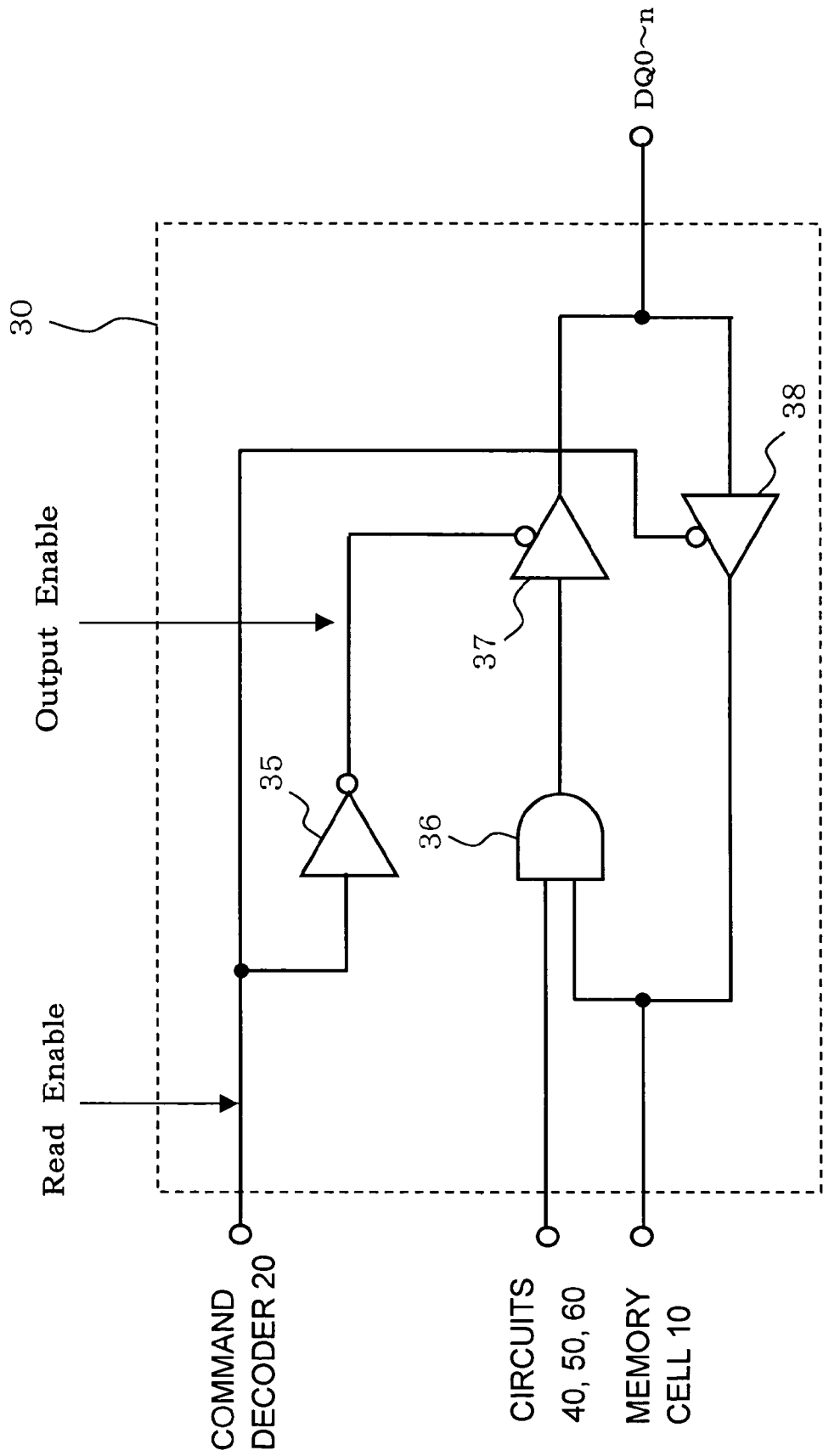
FIG. 5 is a diagram depicting a configuration example of an input and output buffer.

FIG. 5 is a diagram depicting a configuration example of the input and output buffer 30, just like FIG. 4, where a fixed logic is continuously output.

The input and output buffer 30 is comprised of an NOR circuit 35, AND circuit 36, and first and second buffer circuits 37 and 38.

The NOT circuit 35 is connected to the command decoder 20, to which the Enable signal is inputted from the command decoder 20, and from which the OutputEnable signal is outputted.

The AND circuit 36 is connected to the memory cell 10 and the NOR circuit 47 (see FIG. 2), and decides the logic according to the output signal from the comparison circuit 60.

The first buffer 37 stores the output from the AND circuit 36 and outputs it to the terminals DQ0-DQn. The first buffer 37 is a buffer corresponding to the reading of the data from the memory cell 10.

The first buffer 37 is a three-state circuit configuration, and can enter "HIGH", "LOW" and high impedance (hereafter "HIGH-Z") statuses. Whether the first buffer 37 can enter "HIGH-Z" status or not depends on the output signal OutputEnable.

For example, when the output signal OutputEnable is "HIGH", the first buffer 32 enters "HIGH-Z" status, where electronic connection is cleared, and output to the terminals DQ0-DQn is stopped. On the other hand, when the output signal OutputEnable is "LOW", logic according to the input is output.

The second buffer 38 as well can enter the three statuses: "HIGH-Z", "LOW", and "HIGH" based on the signal from the command decoder 20. The second buffer 38 is a buffer corresponding to the writing to the memory cell 10.

FIG. 7 is a waveform diagram depicting the operation of each signal in the configurations shown in FIG. 2 and FIG. 5. This is an example of the case if a probe is connected to the terminal DQ in normal status, and then the status is returned to normal status again.

In normal status, "LOW" is outputted from each circuit 40, 50 and 60. Therefore the output signal Comp of the OR circuit 46 is "LOW". This is inverted by the latch circuit comprised of two NOR circuits 47 and 48, and the detection signal Detect becomes "HIGH".

When the ReadEnable signal, which indicates the reading from the memory cell 10, is being outputted from the command decoder 20 (when ReadEnable is "HIGH"), "LOW" is output from the NOT circuit 35. By this, in the first buffer circuit 37, data is output from the memory cell 10 to the terminals DQ0-DQn.

If a probe is connected to the terminal DQ0, for example, in this status, a signal to indicate the connection of the probe is outputted from the circuits 40, 50 and 60, so the output signal Comp becomes "HIGH". And the detection signal Detect becomes "LOW".

If the detection signal "LOW" is inputted to the AND circuit 36 in a status where the ReadEnable signal "HIGH" is being outputted from the command decoder 20, the output signal thereof becomes "LOW" regardless the logic of the memory cell 10. Therefore the first buffer circuit 37 outputs "LOW", and the reading from the memory cell 10 is fixed to "LOW". In other words, if a probe is connected to the terminal DQ0, the reading from the memory cell 10 maintains "LOW" all the time.

When the probe is removed from the terminal DQ0, the status returns to normal status and the output signal Comp becomes "LOW". In this case, the RESET signal is input from the input end of the NOR circuit 48 shown in FIG. 2 ("HIGH"), and each circuit is returned to normal status. Hereafter the operation performed is the same as the above mentioned normal status.

Figure 6:
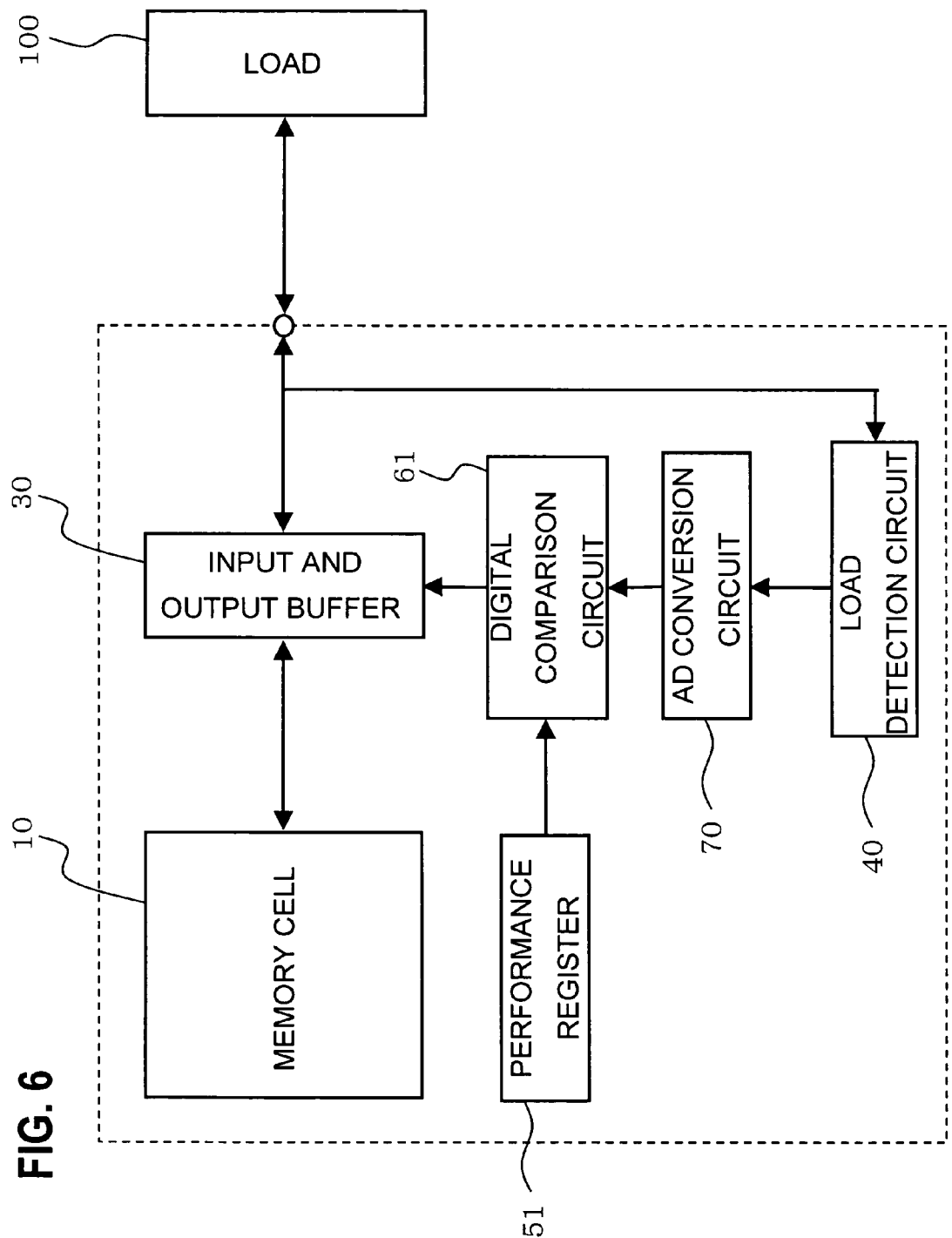
FIG. 6 is a diagram depicting a configuration example of another semiconductor integrated circuit to which the present invention is applied.

In the example shown in FIG. 1, analog values are detected and compared, but the present invention can also be applied to the configuration shown in FIG. 6. In this case, the load value detected by the load detection circuit 40 is converted into a digital value by the AD conversion circuit 70, and is output to the digital comparison circuit 61.

The digital value to indicate a load, if a probe is connected to the terminal DQ, is outputted from the reference register 51, and the digital comparison circuit 61 compares this reference value and the digital value from the AD conversion circuit 70, and outputs the control signal if they match.

In the input and output buffer 30, just like the case of FIG. 1, the output from the memory cell 10 is stopped, or a fixed specific logic is continuously outputted if this control signal is input, so that the data stored in the memory cell 10 cannot be read. Since data is not output from the terminal DQ to the analyzer if the probe is connected, the data cannot be analyzed.

The circuit shown in FIG. 2 is an example, and any circuit configuration may be used only if the output signal Comp or the detection signal Detect, to indicate whether a probe is connected or not, can be output. For example, the OR circuit 46 may be an AND circuit, or the latch circuit (NOR circuit 47 or 48) may be removed.

For the circuits shown in FIG. 3 and FIG. 5 as well, any circuit configuration can be used only if the output from the memory cell 10 can be stopped and a specific logic can be continuously output. For example, an AND circuit may be used instead of the NAND circuit 31. In any case, the same functional effect as the above mentioned example is implemented.

Also in the above example, the case when the memory cell 10 is disposed in the semiconductor integrated circuit 1 was described, but the present invention can also be applied to the case when the memory cell 10 is disposed outside the semiconductor integrated circuit 1. In this case as well, the same functional effect as the above mentioned example is implemented.

The semiconductor integrated circuit 1 shown in FIG. 1 and FIG. 5 can be applied to an information portable terminal, such as a notebook type personal computer, PDA and portable telephone, and in this case as well, the same functional effect as the above mentioned example is implemented.

What is claimed is:

1. A semiconductor device, comprising:
    a load detection portion for measuring load quantity of an electric device connected to a terminal and outputting a control signal if said load quantity substantially matches a reference load;
    an output control portion for stopping the output of data from said terminal or outputting a specific fixed logic to said terminal, responding to said control signal; and
    a storage portion for storing said data, wherein
    said reference load is a load quantity when a probe of an analyzer for reading and analyzing said data is connected to said terminal, and
    said output control portion stops the output of said data stored in said storage portion from said terminal, or outputs a specific logic, responding to said control signal.

2. The semiconductor device according to claim 1, wherein said load detection portion further comprising:
    a reference load output portion for outputting said reference load; and
    a comparison portion for comparing said measured load quantity and said load quantity from said reference load output portion, and outputting said control signal according to the comparison result.

3. The semiconductor device according to claim 1, wherein said load detection portion further comprising:
    a reference register for outputting said reference load which is digitized;
    a digital conversion portion for converting said measured load quantity into a digital value; and
    a comparison portion for comparing said load quantity which has been converted into a digital value and said reference load from said reference register, and outputting said control signal according to the comparison result.

4. A control method in a semiconductor device comprising a load detection portion for measuring load quantity of an electric device connected to a terminal, and an output control portion for outputting data from said terminal, comprising the steps of:
    outputting a control signal from said load detection portion if said measured load quantity substantially matches a reference load; and
    stopping the output of said data from said terminal by said output control portion or outputting a specific fixed logic from said output control portion to said terminal, responding to said control signal, wherein
    said reference load is a load quantity when a probe of an analyzer for reading and analyzing said data is connected to said terminal, and
    said stopping or outputting step stops the output of said data stored in a storage portion from said terminal, or outputs a specific logic, responding to said control signal.

5. A memory device, comprising:
    a load detection portion for measuring load quantity of an electric device connected to a terminal and outputting a control signal if said load quantity substantially matches a reference load;
    an output control portion for stopping the output of data from said terminal or outputting a specific fixed logic to said terminal, responding to said control signal; and
    a storage portion for storing said data, wherein
    said reference load is a load quantity when a probe of an analyzer for reading and analyzing said data is connected to said terminal, and
    said output control portion stops the output of said data stored in said storage portion from said terminal, or outputs a specific logic, responding to said control signal.

* * * * *